United States Patent

Kendall, Jr. et al.

[15] 3,650,844

[45] Mar. 21, 1972

[54] DIFFUSION BARRIERS FOR SEMICONDUCTIVE THERMOELECTRIC GENERATOR ELEMENTS

[72] Inventors: Louis F. Kendall, Jr., Scotia, N.Y.; James H. Bredt, Garrett Park, Md.

[73] Assignee: General Electric Company

[22] Filed: Sept. 19, 1968

Related U.S. Application Data

[63] Continuation-in-part of Ser. No. 575,244, Aug. 26, 1966.

[21] Appl. No.: 760,989

[52] U.S. Cl. .......... 136/237, 136/205

[51] Int. Cl. .......... H01v 1/04

[58] Field of Search .......... 136/205, 237

[56] References Cited

UNITED STATES PATENTS

| | | | |
|---|---|---|---|
| 3,036,139 | 5/1962 | Feduska et al. | 136/237 |
| 3,082,277 | 3/1963 | Lane et al. | 136/237 |
| 3,208,835 | 9/1965 | Duncan et al. | 136/237 X |
| 3,210,216 | 10/1965 | Feduska | 136/237 |
| 3,306,784 | 2/1967 | Roes | 136/237 |
| 3,382,109 | 5/1968 | Kendall, Jr. et al. | 136/237 |
| 3,411,955 | 11/1968 | Weiss | 136/205 |

FOREIGN PATENTS OR APPLICATIONS

| | | | |
|---|---|---|---|
| 952,678 | 3/1964 | Great Britain | 136/237 |

*Primary Examiner*—Benjamin R. Padgett
*Assistant Examiner*—Harvey E. Behrend
*Attorney*—Richard R. Brainard, Paul A. Frank, Charles T. Watts, Frank L. Neuhauser, Melvin M. Goldenberg and Oscar B. Waddell

[57] ABSTRACT

In the manufacture of thermoelectric generators of the lead telluride type, it is desirable that the joints between the thermoelements and the electrodes or bridging members have low electrical resistance and resist fracture during thermal cycling. When materials having a linear coefficient of thermal expansion which is near that of the lead telluride, such as AISI Type 300 stainless steels are used, mechanical failure due to thermal mismatch is eliminated, but unwanted diffusion from the ferrous body into the lead telluride. It has been found that a thin diffusion barrier of iron, molybdenum or tungsten will prevent this degradation.

6 Claims, 1 Drawing Figure

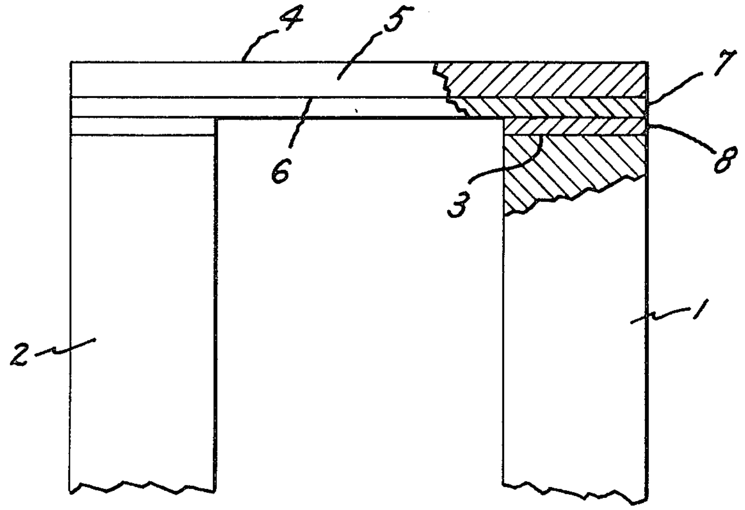
Inventors:
Louis F. Kendall,
James H. Bredt,
by Jane M. Binkowski
Their Attorney.

DIFFUSION BARRIERS FOR SEMICONDUCTIVE THERMOELECTRIC GENERATOR ELEMENTS

This application is a continuation-in-part of copending application Ser. No. 575,244 filed on Aug. 26, 1966 by the same inventors and assigned to the same assignee.

This invention relates to the thermoelectric generation of power and particularly to the improved fabrication of generator elements comprising semiconductive lead telluride.

The accompanying FIGURE is a view in elevation partly in section of a preferred embodiment of a thermoelectric generator junction of the present invention.

Lead telluride thermocouples for the direct conversion of heat energy to electric energy have been known for some time. Superficially, these thermocouples operate in the same manner as earlier developed "metal" thermocouples, such as chromel-alumel, iron-constantan, and platinum-platinum rhodium, for example. In detail, however, the lead telluride thermocouple is quite different from the metal thermocouples in that it is a semiconductive device and has a thermoelectric heat conversion efficiency of up to ten times that of the metal thermocouples. For a more detailed discussion of these semiconductive thermocouples see "Direct Conversion of Heat to Electricity," edited by Kay and Welch, John Wiley and Sons, Inc., New York, 1960, Chapter 16, p. 16-5.

In general, these thermocouples have been made by establishing an electrical connection between a P-type lead telluride semiconductor body and an N-type lead telluride semiconductor body by means of a conductive metallic bridging element. Usually, the two lead telluride bodies are arranged in spaced relationship in contact with one side of a platelike body of the metal bridging element which functions to establish an electrically conductive path between the two lead telluride bodies and as a heat transfer medium. This three-piece assembly constitutes the hot junction of the thermocouple. The ends of the lead telluride bodies remote from the bridging member are each connected to a conductor for connection to the circuit or electrical device utilizing the generated power. Obviously, a plurality of such hot junctions may utilize heat from a common source and their individual outputs may be connected in series or parallel into a common circuit, if desired.

Unfortunately, a number of difficulties have been encountered which have prevented the practical application of these thermocouples. A principal difficulty has been in the inability to produce a reliable low resistance electrical contact between the lead telluride elements and the bridging member. This difficulty has been particularly acute with respect to the P-type lead telluride. Prior to this invention, the most satisfactory solution to this problem has been the brazing technique disclosed by Weinstein and Mlavsky, "Review of Scientific Instruments," Volume 33, p. 1119, (1962). In this technique, a brazing material, tin telluride, is interposed between the lead telluride body and a substantially pure iron bridging member and the members secured together by fusion and subsequent solidification of the brazing material. A good bond having low electrical resistance may thereby be achieved which maintains its integrity at elevated temperatures encountered in use so long as it is not subjected to thermal cycling. If a hot junction formed in this manner is subjected to heating to about 600° C. followed by cooling to less than 100° C. in a repeated cyclical manner, the brazed joint fails after a relatively few heating and cooling cycles. This failure has been found to originate at the tin telluride-iron interface and is due to the presence of a brittle layer.

As disclosed in copending patent application Ser. No. 402,950, filed Oct. 9, 1964 by the present applicants, entitled "Thermoelectric Generators" and assigned to the assignee of this application, it was found that the inclusion of a small but effective amount of antimony at the tin telluride ferrous metal interface eliminated the brittle layer and permitted these thermocouples to be thermally cycled without failure of the brazed joint due to the brittle layer. It has been observed that when the ferrous metal is essentially unalloyed iron such as commercial "ingot iron" having a nominal composition of 0.012 weight percent carbon, 0.017 percent manganese, 0.005 percent phosphorous, 0.025 percent sulfur, a trace of silicon, balance substantially all iron, thermal cycling of the thermoelectric generator elements produced fine cracks in the body of the lead telluride which may eventually lead to failure even though the braze is sound. Furthermore on occasion, such cracks were produced by the thermal cycle of the brazing operation. These cracks are believed to be due to the relatively large difference between the coefficient of thermal expansion of lead telluride, 21 x $10^{-6}$/°C. and 14 x $10^{-6}$/°C. for ingot iron, both for the temperature range of 32 to 1,200° F. When AISI Type 300 stainless steels having coefficients of thermal expansion ranging from 18.7 × $10^{-6}$/°C. to 19.1 × $10^{-6}$/°C. were substituted for the ingot iron after heat treatment in a vacuum to remove volatile contaminants, thermal cycling did not produce the cracks in the lead telluride. It has subsequently been discovered that the distribution of the doping agent in the lead telluride is deleteriously affected in the region of the braze layer when stainless steel electrodes are used, causing undesirable change in the electrical properties, notably increased resistance, in the affected zone. This is believed to result from the diffusion of chromium during the brazing cycle from the stainless steel through the molten tin telluride into the lead telluride where it reacts with the free tellurium present in the P-type material causing an increase in electrical resistance. Furthermore, nickel readily dissolves in molten tin telluride and reacts with lead telluride to form a eutectic mixture, lowering the effective working temperature at which the generator can be operated, among other things.

The diffusion of elements such as chromium and nickel progresses at a much higher rate at the hot junction than at the cold junction. Even when the brazing material, for example, tin telluride, is eliminated and a mechanical joint is made by pressing the semiconductive material against the hot junction stainless steel bridging member, degradation of the lead telluride still occurs by the diffusion process during operation. It would be desirable to retain the advantages of these stainless steels in such generators and eliminate the undesirable characteristics set forth above.

It is therefore a principal object of this invention to provide a lead telluride-metal electrode wherein the coefficients of thermal expansion of both electrode members are substantially equal and wherein the composition of the lead telluride material is not deleteriously altered during the assembly of the elements nor during subsequent thermal cycling.

It is a further object of this invention to provide a thermocouple hot junction assembly comprising lead telluride electrode members and a ferrous metal bridging member which are assembled by a brazing operation wherein the physical properties and the chemical composition of the elements are not substantially changed during the brazing operation.

Other and different objects of the invention will become apparent to those skilled in the art from the following disclosure.

Briefly stated, in accordance with one embodiment of this invention, a thermoelectric generator element is provided wherein a brazed or mechanical joint is formed between a lead telluride electrode element and a metallic member consisting of clad metallic support element wherein the cladding is interposed between the brazing material and the support member and functions as a diffusion barrier. The barrier layer is formed from iron, molybdenum or tungsten.

In the accompanying FIGURE, which illustrates a preferred embodiment of a thermoelectric generator junction of the present invention, parts have been broken away to more clearly illustrate the junction, and it will understood that certain dimensions have been exaggerated to more clearly illustrate the relationship of the several parts thereof. Specifically, a P-type 1 and an N-type 2 body of a semiconductive lead telluride are shown with body 1 being provided with a first surface 3. An electrically conductive member 4 having a composite structure comprising a metallic support member 5 having a second surface 6 is provided as a bridging member between bodies 1 and 2. A thin impervious adherent layer 7 of a metal selected from substantially pure iron, molybdenum or tungsten is diffusion bonded to surface 6. Surface 3 is bonded to layer 7 by means of a brazed tin telluride joint 8, as shown.

More particularly, the invention may best be illustrated by the following specific examples.

EXAMPLE 1

The surface of AISI Type 302 stainless steel electrode formed from 0.020 inch thick sheet was polished and a piece of 0.002 inch thick foil composed of substantially pure iron placed thereon. The iron foil was diffusion bonded to the polished stainless steel surface by heating the two members in vacuum to a temperature of 800° C. for ¼ hour while the members were pressed firmly together under a load applied by differential thermal expansion of the members of the bonding jig. A thermocouple was fabricated by brazing a P-type and an N-type thermoelement, each being composed of appropriately doped lead telluride hemicylinders ½ inch in diameter by ¼ inch long, to a bridging member formed from the previously described iron clad stainless steel to form a hot junction using tin telluride having a melting point of about 805° C. as the brazing material between the iron cladding and one semicircular end of each of the lead telluride elements. Two iron clad stainless steel output electrodes were similarly bonded to the opposite ends of the lead telluride electrodes. The resistance profiles of the lead telluride elements were measured and found to be linear, showing that the resistance of the braze layers did not exceed that of an equivalent thickness of lead telluride. The thermocouple was then tested under 100 p.s.i. spring pressure between a heat source applied to the bridging member maintained at a temperature of about 500° C. and a water-cooled heat sink applied to the output members maintaining a temperature thereof of about 100° C. The thermocouple was operated under these conditions for 1,030 hours with 212 thermal cycles wherein the heat source was allowed to come to room temperature and then reheated to 500° C. At least through the first 150 cycles there was no detectable degradation due to thermal cycling, although some degradation due to a contaminated atmosphere did occur.

The test was terminated to permit examination of the thermocouple by metallographic section. Some small fatigue cracks were observed at points of stress concentration beside voids in the braze layer, but no other mechanical or chemical defects could be detected in or near the brazed joints.

EXAMPLE 2

Another thermocouple was prepared and tested as set forth in Example 1. The test was terminated after 750 hours and 37 thermal cycles. Metallographic examination did not reveal any chemical or mechanical defects in and near the brazed joints.

EXAMPLE 3

Another thermocouple was prepared and tested as set forth in Example 1. The test was terminated after 500 hours and 36 thermal cycles. Again, metallographic examination did not reveal any chemical or mechanical defects in and near the brazed joints.

The thermoelectric properties of all of these couples were quite similar and all satisfactory. For example, the thermocouple of Example 1 exhibited initial resistivities of 2.69 milliohms for the p-leg and 3.42 milliohms for the N-leg, and a Seebeck coefficient of 198 microvolts per degree for the P-leg and 219 microvolts per degree for the N-leg. The couple produced 1.05 watts of power. After 12 thermal cycles, the P-leg resistance was 3.68 milliohms and the N-leg resistance was 3.21 milliohms. After 52 cycles the P-leg resistance was 3.68 milliohms and the N-leg resistance was 3.40 milliohms.

EXAMPLE 4

A thermal was formed by diffusion bonding 0.002 inch thick molybdenum foil to the surface of ⅛ inch thick AISI Type 347 stainless steel and a P-type lead telluride thermoelement was bonded to the molybdenum surface by the tin telluride brazing process. The assembly had a junction resistance of 35 microohms and the resistivity of the lead telluride was unchanged. The assembly was sealed in an evacuated quartz tube and heated to 600° C. and cooled to 110° C. 32 times. The junction resistance increased to 160 microohms, an acceptable change for thermoelectric generator applications. Metallographic sections taken perpendicularly to the braze layer were essentially indistinguishable from those previously examined of ironclad assemblies.

A most significant feature of this assembly is that it has only a very small magnetic permeability. Considerable effort has previously been made in unsuccessful attempts to make "non-magnetic" electrodes for lead telluride thermocouples, particularly for certain space applications.

EXAMPLE 5

Another thermocouple was prepared wherein the thermoelements were spring pressed against a thin layer of tin telluride braze material on the prepared surface of a body of ingot which was provided with electrical heating means. The hot junction temperature was maintained constant at about 420° C. while the cold junction was maintained constant at about 200° C. The change in electrical properties as a function of time are shown in the following table. These values are for the P-type leg only since there was no appreciable change in the N-type leg.

| Time (hours) | Resistance (milliohms) | Seebeck coefficient (micro-volts/° C.) | Power (watts) |
|---|---|---|---|
| Initial | 12.21 | 213.5 | 0.128 |
| 2,080 | 15.08 | 220.9 | 0.119 |
| 10,900 | 20.98 | 233.9 | 0.103 |
| 19,316 | 23.0 | 236.6 | 0.098 |

EXAMPLE 6

Another thermocouple was prepared as described in Example 5 except that molybdenum foil was interposed between the ingot iron surface and the braze material and the hot junction was operated at about 480° C. The change in electrical properties with time during testing is shown in the following table.

| Time (hours) | Resistance (milliohms) | Seebeck coefficient (micro-volts/° C.) | Power (watts) |
|---|---|---|---|
| For the n-type leg: | | | |
| Initial | 14.80 | 252.5 | 0.161 |
| 2,140 | 14.32 | 248.8 | 0.153 |
| 10,376 | 13.60 | 243.2 | 0.140 |
| For the p-type leg: | | | |
| Initial | 15.74 | 229.3 | |
| 2,140 | 17.21 | 226.9 | |
| 10,376 | 19.20 | 221.4 | |

Using procedures similar to those described in the foregoing examples, diffusion barriers of iron, molybdenum and tungsten were tested using tin telluride in bonded as well as unbonded lead telluride terminal constructions and in terminals without the tin telluride layer between the lead telluride and the barrier member. It was found that the presence or absence of the tin telluride had little or no effect upon degradation of the lead telluride.

While the foregoing examples have been disclosed as utilizing stainless steel members which have been clad with iron and molybdenum on only one surface, it is obvious that both sides and the edges may also be clad if desired and that tungsten may also be used. It will also be apparent that other methods for providing the cladding may be employed, such as, for example, roll cladding as well as other well-known cladding techniques. The thickness of the barrier coating does not appear to be particularly critical but it must not have openings in it through which the tin telluride can penetrate and reach the stainless steel. Furthermore, it must be thin enough to avoid exerting stress on the lead telluride. Mechanically, the metal part acts as though it were stainless steel. It will be observed that the solid state diffusion of chromium and nickel through iron, molybdenum and tungsten is substantially infinitesimal at the temperatures employed.

Furthermore, while the iron cladding material has been specifically disclosed as being commercial ingot iron, it will be obvious that other substantially pure irons may be employed. Yet further, it will apparent that while AISI Type 300 stainless steels have been specifically disclosed as the bridging member, any metal or alloy having a coefficient of thermal expansion in the range given for these stainless steels, or even somewhat greater or lesser may be employed provided it is chemically and metallurgically compatible with the cladding and, in brazed constructions, has a melting point or "solidus" temperature greater than the brazing temperature, and has acceptable electrical properties, since all the lead telluride "-sees" is the brazing alloy-cladding interface. No reason is apparent why alloys such as "constantan," a 45 percent nickel, 55 percent copper, 80–20 brass, 70–30 cartridge brass, 3 percent silicon bronze, 1.5 percent silicon bronze, aluminum bronzes, or beryllium copper, for example, all of which meet the previously stated requirements, could not be employed. With respect to the range of coefficient of thermal expansion, metals and alloys having coefficients of thermal expansion lying between about $16 \times 10^{-6}$ per degree Celsius and about $24 \times 10^{-6}$ per degree Celsius measured between 32° and 1,200° F. are contemplated, however, it is obviously more desirable to employ alloys having a coefficient of thermal expansion which most nearly matches the coefficient of thermal expansion of lead telluride.

In view of the foregoing, it is not intended to restrict the scope of the invention to the specific examples disclosed but only to the invention defined by the following claims.

What we claim as new and desire to secure by Letters Patent of the United States is:

1. A thermoelectric generator junction comprising a semiconductive lead telluride member providing a first surface, an electrically conductive member having a composite structure comprising a metallic support member having a second surface, said second surface being covered by a thin impervious, adherent layer of a metal selected from the group consisting of substantially pure iron, molybdenum and tungsten diffusion bonded to said second surface, said first surface being in intimate contact with and secured to said layer, and said support member having a coefficient of thermal expansion between about $18 \times 10^{-6}$/°C. to about $19 \times 10^{-6}$/°C.

2. A thermoelectric generator element according to claim 1 wherein said support member is composed of an AISI Type 300 stainless steel.

3. The thermoelectric generator element according to claim 2 wherein said layer is composed of iron.

4. The thermoelectric generator element according to claim 2 wherein said layer is composed of molybdenum.

5. The thermoelectric generator element according to claim 2 wherein said layer is composed of tungsten.

6. The thermoelectric generator element according to claim 2 wherein said first surface is joined to said layer by means of a thin telluride brazed joint.

* * * * *